US010446215B1

(12) United States Patent
Hughes et al.

(10) Patent No.: US 10,446,215 B1
(45) Date of Patent: Oct. 15, 2019

(54) SYSTEM AND METHOD FOR ADAPTIVELY OPTIMIZED REFRESH OF MEMORY

(71) Applicant: CADENCE DESIGN SYSTEMS, INC., San Jose, CA (US)

(72) Inventors: Anne Hughes, Austin, TX (US); John MacLaren, Austin, TX (US); Devika Raghu, Bangalore (IN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 44 days.

(21) Appl. No.: 15/353,150

(22) Filed: Nov. 16, 2016

(51) Int. Cl.
*G11C 11/406* (2006.01)
*G11C 11/4096* (2006.01)
*G06F 3/06* (2006.01)

(52) U.S. Cl.
CPC ...... *G11C 11/40615* (2013.01); *G06F 3/0619* (2013.01); *G06F 3/0659* (2013.01); *G06F 3/0673* (2013.01); *G11C 11/4096* (2013.01)

(58) Field of Classification Search
CPC ............. G11C 11/40615; G06F 3/0619; G06F 3/0659; G06F 3/0673
See application file for complete search history.

(56) References Cited

U.S. PATENT DOCUMENTS 6,463,001 B1 * 10/2002 Williams ............ G06F 13/1636
365/189.12
9,576,637 B1 * 2/2017 Balakrishnan .... G11C 11/40615
2012/0144105 A1 * 6/2012 Dodson ............. G11C 11/40603
711/106
2015/0127898 A1 * 5/2015 Cordero ............. G06F 13/1636
711/106

OTHER PUBLICATIONS

Mutlu, Computer Architecture Lectuer 25: Main Memory, Apr. 3, 2013 [retreived from internet Feb. 21, 2018][<URL:file:///C:/Users/npaperno/Desktop/onur-447-spring13-lecture25-mainmemory-afterlecture.pdf>] (Year: 2013).*

(Continued)

*Primary Examiner* — David Yi
*Assistant Examiner* — Nicholas A. Paperno
(74) *Attorney, Agent, or Firm* — Tarolli, Sundheim, Covell & Tummino LLP (57) ABSTRACT

A system and method are provided for system for adaptive refresh of a memory device having multiple integrated circuit chips. A command generation portion generates commands for actuating a plurality of operational tasks on the memory device, including at least read, write, and refresh operations for selectively addressed storage cells of the memory device. A command management portion stores the commands and selects from the commands for timely execution of corresponding operational tasks on the memory device. A refresh management portion coupled to the command generation and command management portions actuates a plurality of refresh operations adaptively interleaved with other operational tasks, such that recursive refresh of the storage cells is carried out for the memory device within a predetermined refresh window of time. The refresh management portion selectively actuates each refresh operation for a chip-based selection of storage cells, whereby the storage cells of a selected chip are refreshed.

20 Claims, 4 Drawing Sheets

(56) References Cited

OTHER PUBLICATIONS

Lee et al., "Simultaneous multi-layer access: Improving 3D-stacked memory bandwidth at low cost." ACM Transactions on Architecture and Code Optimization (TACO), vol. 12, No. 4 pp. 63, Jan. 2016 [retreived from internet Feb. 16, 2018][<URL: https://dl.acm.org/citation.cfm?id=2832911>] (Year: 2016).*

Memory Refresh, Wikipedia, Nov. 5, 2015 [retrieved form internet Jul. 2, 2018][<URL:https://web.archive.org/web/20151125040422/https://en.wikipedia.org/wiki/Memory_refresh>} (Year: 2015).*

What do CHannel Interleaving and Rank Interleaving settings mean in BIOS, Stack Exchange, 2013 [retrieved from internet Jul. 2, 2018}{<URL:https://superuser.com/questions/606742/what-do-channel-interleave-and-rank-interleave-settings-mean-in-bios>] (Year: 2013).*

Balasubramonian, A DRAM Refresh Tutorial, Utah Arch, Nov. 2013, [retrieved from internet Jan. 22, 2019][<URL:http://utaharch.blogspot.com/2013/11/a-dram-refresh-tutorial.html>] (Year: 2013).*

\* cited by examiner

SYSTEM AND METHOD FOR ADAPTIVELY OPTIMIZED REFRESH OF MEMORY

BACKGROUND OF THE INVENTION

The subject system and method are generally directed to memory controllers having measures for carrying out ongoing maintenance refresh operations for a memory device in optimized manner More specifically, the subject system and method provide for a memory controller that is executable to adaptively actuate ongoing refresh operations so as to minimize disruption to operational data transactions for accessing the memory device. The subject system and method preferably carry out such adaptively optimized refresh of memory while preserving compliance with applicable memory maintenance requirements.

Memory controllers are well known in the art. They are implemented as digital circuits dedicated to controlling/managing the flow of data written to and read from one or more memory devices, and to preserve the same by periodically refreshing the memory as needed. They may be suitably formed as separate devices or integrated with a central processing unit or other main controller, and serve the memory storage and access needs of various control or user application 'master' operations processed thereby. Memory controllers implement the logic necessary to read from and write to various types of solid state memory devices, examples of which include dynamic random access memory (DRAM), as well as electrically programmable types of non-volatile memory such as flash memory, and the like.

Refresh operations essentially replenish the charge stored in the memory cells of a solid state memory device. While not all solid state memory devices require periodic refresh, many memory devices configured for high speed access, such as DRAM devices, require sufficiently consistent level of periodic refresh for data stored in its memory cells to be adequately preserved. The capacitive storage cells typically employed in various memory devices do not hold electric charge indefinitely, and tend to lose their charge over time. Unless refreshed on average at least once within a certain maximum interval of time, a storage cell may be subject to corruption for that reason. Industry standards such as those established by the Joint Electron Device Engineering Council (JEDEC) for semiconductor memory circuits and devices, for example, enforce this requirement through an average periodic refresh interval time parameter, commonly referred to under JEDEC standards as tREFI. This parameter derives from a refresh time window parameter, commonly referred to under JEDEC standards as tREFW, and a minimum number of refreshes for all available banks (a predetermined array of memory cells) of the memory device required within each rolling period of time equaling such window in duration.

Automatic refresh is carried out as a periodic yet ongoing maintenance requirement, and therefore comes at operational costs. The costs of refresh typically include such performance implications as the need to close a page (typically defined as a row of memory cells of a particular bank) before it may be refreshed. If a particular page of memory has been opened (activated) for execution of a memory access transaction, the page must be closed (made idle) before refresh may occur. During refresh, a page remains closed, such that reading and writing to that part of memory is disabled.

Each refresh cycle thus entails a cost in terms of time latency. That is, from the time a refresh command issues for a row of memory cells, some minimum time delay must transpire in practice before that same row of memory cells may be accessed again (as denoted, for example, by the parameter tRFC commonly referred to under JEDEC as the refresh recovery time). In addition to this recovery time, delay components are also incurred: from the time data is actually stopped to when a page is actually closed; from the time the page is closed to when a refresh command issues; and, from the time the page is opened to when data access gets underway. The sum of all such delays amounts to a period where the given part of memory essentially remains offline in terms of data accessing operation, potentially lengthening the total operational time required for transfer of read/write data back and forth from memory.

Tasks like closing and reopening a page come also with power implications. Repeatedly executing such tasks in carrying out refresh commands, for example, often results in large enough current draws to require special handling. This may pose undue risk of corruptive failure.

Refresh operations may therefore consume considerable overhead and measurably encumber memory performance in a given application. In other words, refresh makes for a direct hit on bandwidth utilization of a memory device.

To minimize the disruptive effects of refresh on memory utilization, system developers have turned with limited success to systematic approaches like providing the option of not only a blanket refresh of the entire device, but also a more granular refresh of a given memory device on a per-bank basis. Although the approach permits those banks not targeted by a pending refresh command to continue being accessed for read and write commands, it requires a considerably greater number of refresh commands to cover all banks of the memory device. Depending on the application, this may inject needless delay, as the collective overhead time costs for issuing the added refresh commands may become prohibitively high.

There is therefore a need for a memory controller system and method capable of automatically actuating refresh operations on a memory device, while preserving compliance with applicable operational requirements. There is also a need for a memory controller system and method which provides adaptive refresh of different portions of a memory device to mitigate the costs of refresh and optimize the efficiency and flexibility of memory utilization. There is a need, moreover, for a memory controller system and method provides for such adaptive refresh to be carried out at multiple selective levels of granularity.

SUMMARY OF THE INVENTION

It is an object of the present invention to provide a system and method for memory control automatically actuating refresh operations on a memory device, while preserving compliance with applicable requirements for timely completion of periodic refresh cycles.

It is another object of the present invention to provide a system and method for memory control adaptively self-actuating refresh of different portions of a memory device to mitigate the costs of refresh and optimize the efficiency and flexibility of memory utilization.

It is yet another object of the present invention to provide a system and method for memory control executing adaptive refresh to be carried out at multiple selective levels of granularity.

These and other objects are attained in a system for adaptive refresh of a memory device having multiple integrated circuit chips. The system comprises a command generation portion executable to generate commands for actuating a plurality of operational tasks on the memory device. The operation tasks include at least read, write, and refresh operations for selectively addressed storage cells of the memory device, where each chip of the memory device defines a plurality of banks, and the storage cells of each bank are organized in a plurality of individually accessible pages. A command management portion is coupled to the command generation portion, which command management portion includes a command queue unit and an execution strategy unit coupled thereto. The command queue unit stores the commands for operational tasks on the memory device awaiting execution. The execution strategy unit selects the commands stored in the command queue unit for timely execution of corresponding operational tasks on the memory device. A refresh management portion is coupled to the command generation and command management portions for actuating a plurality of refresh operations adaptively interleaved with other operational tasks, such that recursive refresh of the storage cells is carried out for the memory device within a predetermined refresh window of time. The refresh management portion includes a chip refresh unit executable to selectively actuate each refresh operation for a chip-based selection of storage cells, whereby the storage cells in all banks of a selected chip are refreshed.

In accordance with certain embodiments of the present invention, a method is provided for adaptive refresh of a memory device having multiple integrated circuit chips. The method comprises defining a plurality of banks in each chip of the memory device, wherein each bank is organized into a plurality of individually accessible pages, with each page formed by a plurality of storage cells. The method also comprises executing a command generation portion implemented in a processor to generate commands for actuating a plurality of operational tasks on the memory device. The operational tasks include at least read, write, and refresh operations for selectively addressed storage cells of the memory device. The method additionally comprises a command management portion implemented in a processor. The command management includes storing the commands for operational tasks on the memory device in a computer readable command queue unit to await execution; and, actuating an execution strategy unit coupled to the command queue unit to select the commands stored therein for timely execution of corresponding operational tasks on the memory device. A refresh management portion implemented in a processor is executed for actuating a plurality of refresh operations adaptively interleaved with other operational tasks, wherein full recursive refresh of the storage cells is carried out for the memory device within a predetermined refresh window of time. The refresh management includes a per-chip refresh executable to selectively actuate each refresh operation for a chip-based selection of storage cells, whereby the storage cells in all banks of a selected chip are refreshed.

In accordance with certain other embodiments, a memory controller system is provided for adaptive refresh of a memory device having multiple integrated circuit chips with selective granularity of refresh. The system comprises a command generation portion executable to generate commands for actuating a plurality of operational tasks on the memory device, which operational tasks include at least read, write, and refresh operations for selectively addressed storage cells of the memory device. Each chip of the memory device defines at least one logical rank containing a plurality of banks, wherein each bank is organized into a plurality of individually accessible pages, with each page being formed by at least one row of storage cells. A command management portion is coupled to the command generation portion, and includes a command queue unit which stores the commands for operational tasks on the memory device awaiting execution, and an execution strategy unit coupled to the command queue unit to select from the commands stored therein for timely execution of corresponding operational tasks on the memory device. A refresh management portion is coupled to the command generation and command management portions for actuating a plurality of refresh operations adaptively interleaved with other operational tasks, such that full recursive refresh of the storage cells is carried out for the memory device within a predetermined refresh window of time. The refresh management portion includes a bank refresh unit executable to selectively actuate each refresh operation for a bank-based selection of storage cells, whereby the storage cells in a selected bank are refreshed; and, a rank refresh unit executable to selectively actuate each refresh operation for a rank-based selection of storage cells, whereby the storage cells in all banks of a selected rank are refreshed. The rank refresh unit includes a refresh monitoring section for each selectable rank of the memory device, said refresh monitoring section and a refresh control section coupled to each said refresh monitoring section. The refresh monitoring section maintains a refresh deferral history for the selectable rank within the predetermined refresh window, and the refresh control section generates a refresh request for at least one of the selectable ranks responsive to the refresh deferral histories and activity states of the selectable ranks as to execution of an operational task thereon within a predefined period of pendency.

DETAILED DESCRIPTION OF THE PREFERRED EMBODIMENTS

Reference is now made in illustrative level of detail to exemplary embodiments, which are illustrated in the accompanying drawings, wherein like reference numerals refer to like elements throughout. The embodiments are described below in order to illustrate and explain the disclosed system and method with reference to the drawing figures.

Periodically scheduled refresh operations for volatile memory devices requiring periodic refresh for proper operation like DRAM devices, for example, generally involves precharging to prepare the memory cells of a certain bank or chip, then reading and immediately re-writing the data stored in the memory cells. This restores the charge capacitively held in each of the refreshed memory cells. To preserve proper operation, this must be done for the entire device at least once every benchmark time period for that class and/or type of device. That is, the device must be fully refreshed frequently enough to meet a refresh time period requirement specified by applicable industry standards, such as certain JEDEC standards for microelectronic memory devices.

While memory refresh is carried out as an underlying maintenance process not normally noticeable to the user, it is often disruptive to the device's normal read and write operations for data transactions. As noted, the cells of DRAM memory devices are typically activated and deactivated ('opened' and 'closed') a page at a time within each distinct bank. Read or write operations for the cells in a certain page of a given bank cannot occur while that page is undergoing a refresh process. A wholesale refresh of all memory cells of a device would temporarily disable normal read/write access to that device, until for instance a rolling process of page-by-page refresh were carried out systematically for every bank and every chip/rank of the device.

In accordance with certain aspects of the present invention, the subject memory controller system and method adaptively actuates the required memory refresh to the extent possible during those time periods when the memory cells to be refreshed are idle—that is, free of data transactions like read/write operations. Briefly, the subject system and method provide for a memory controller that actuates incremental refresh of a memory device whose memory cells require recursive periodic refresh to maintain proper operation. The memory controller preferably includes suitable refresh management measures to automatically actuate the sufficient incremental refresh operations through suitable refresh commands that are adaptively scheduled to minimize disruption of normal read/write or other functional transactions requiring memory access. As an alternative to a refresh all cycle, where all selectable chips (or ranks) of the device are refreshed, the memory controller provides such adaptively scheduled refresh commands preferably at different selective levels of granularity, including for instance: refresh on a per-bank basis and refresh on a per-chip (or per-rank) basis.

During operation, the memory controller supports one or more control or user application operations executed on a central processing unit or other main controller (collectively referred to herein as 'master' operations or 'master' control operations), providing the memory storage and access needs of such master control operations. When data is to be written to memory for storage or read out as prompted by a master control operation, the memory controller processes such tasks, scheduling and carrying out the required read/write access to the memory cells in question. The memory controller thus guides access to the proper chips/ranks, banks, rows, and columns by which individual memory cells are typically addressed. The memory controller also carries out the underlying maintenance operations required in order to preserve proper operation of the memory device.

Where possible, the memory controller automatically interleaves maintenance operations like refresh with the more substantive operations for actual data transactions. In accordance with certain aspects of the present invention, the subject memory controller is preferably configured to intelligently schedule memory refresh at a selectable bank or chip (or rank, where a chip defines multiple selectable ranks) during those periods when a bank or chip/rank is to remain inactive as to such data transactions—nor expected to be active at any time within a predefined proximity in time or operational sequence. The memory controller thus actuates the adaptively scheduled refreshing of the memory device, preferably in selectively controlled increments (for example, bank or chip). The memory controller also provides for refreshing the entire device, or remaining unrefreshed banks or chips of the device—typically as an override measure—whenever the need arises, so as to ensure completion of full refresh within the time and/or rate of refresh allotted by applicable requirements.

Figure 1:
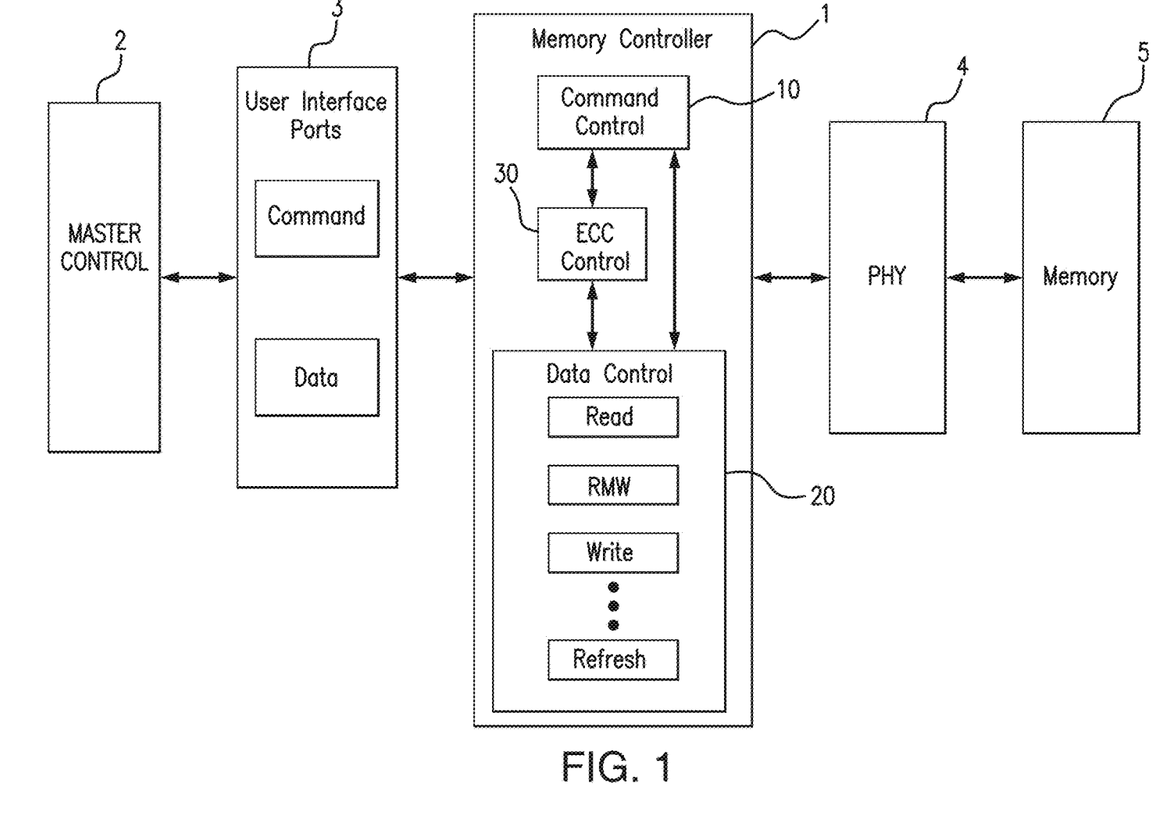
FIG. 1 is a schematic diagram illustrating a system formed in accordance with one exemplary embodiment of the present invention, operably intercoupled to provide control of memory to support processing of a master control operation, in one illustrative application.

Referring now to FIG. 1, there is shown a general schematic diagram illustrating a memory controller system 1 formed in accordance with one exemplary embodiment of the present invention operably intercoupled with other subsystems in one illustrative application. This is but one of numerous applications in which memory controller system 1 may be implemented. As generally shown, for example, the memory controller system 1 serves to provide control of a memory 5 (formed by one or more memory devices of any suitable type and configuration known in the art) to support processing of a master control operation by a master controller 2. The memory controller system 1 communicates with the master controller 2 through one or more user interface ports 3, and with the memory device(s) 5 through a physical interface (PHY) 4 configured with a suitable interface standard known in the art for the memory 5.

The overall system schematically illustrated in FIG. 1 may be implemented in any known form, depending on the particular requirements of the intended application. For example, the overall system may be realized by discretely interconnected subsystems, or in sufficiently integrated in the form of a system-on-chip (SOC) or the like, depending again on the particular requirements of the intended application. As the master controller, user interface port, PHY, and memory subsystems 2, 3, 4, and 5 may be of any suitable type and configuration known in the art, subject to the particular requirements of a given application, no further description thereof is needed for description of features relating to the memory controller system 1. Those skilled in the art will recognize that the overall system shown will typically include numerous other subsystems, logic components, driver circuit portions, and the like other than those generally illustrated in FIG. 1 to carry out its particularly intended functions. In the interests of brevity and clarity, those particular functions outside the system and method disclosed herein are not shown, but will be apparent to those skilled in the art in the context of the particular application intended.

Memory controller system 1 generally includes a command control segment 10 coupled to an operation control segment 20 and an error control segment 30. In the embodiment shown, the operation control segment 20 preferably includes one or more digital circuits which implement the functional logic to carry out a plurality of memory access operations on memory device 5. These data access operations include suitable measures for executing various data transaction operations like read, write, and read-modify-write conducted on selectively addressed storage locations defined in the memory device 5. The data access operations also include suitable measures for executing maintenance operations like periodic refresh (as required by the particular type of memory device(s) 5 employed).

The error control unit 30 is operably coupled to the operation control segment 20, and preferably includes one or more digital circuits which implement the functional logic for detecting and correcting error in data segments as stored in memory device 5. The error control segment 30 preferably includes execution of ECC processing of predetermined code format to detect error in a corrupted data segment read from the memory device 5. The error control segment 30 is configured to correct the data segment read from the memory having error that is correctable with the given ECC, and report (for the master control operation) those data segment errors which are detected but are not correctable with the given ECC.

In an exemplary embodiment and illustrative application, the memory controller system 1 is configured to control a memory device formed by a plurality of independently accessible/selectable integrated circuit (IC) chips, wherein each chip of the memory device defines a plurality of banks. Each bank is preferably organized in illustrative applications with its storage cells arrayed in rows and columns, with each row of storage cells of that bank preferably forming an individually accessible page of cells. Each selectable chip defines at least one selectable rank. In certain cases, a physical chip is suitably configured with multiple distinct storage units (such as front and rear sides of a double sided memory structure, or different stacked components of a 3DS stacked memory structure) respectively defining multiple, independently accessible/selectable ranks. Except to the extent their distinction is made applicable by the structural makeup of a given memory device, the terms chip and rank are used synonymously herein. Unless otherwise indicated, a chip or rank may be referred to herein by shorthand reference to the chip select (CS) designations by which they are addressed.

Depending upon its type and class, known memory devices typically define between 2 to 16 banks of memory. The banks of different devices are sized with widely varying numbers of pages, though typically ranging from $2^{12}$ to $2^{18}$ pages of memory cells within each bank. In a typical DRAM memory device, only one page may be open at a time within each of its banks. Thus, in an 8-bank device, as many as 8 unique pages may be open at any given time, one page in each bank. To gain access to a different page within the same bank, the currently open page must first be closed before that different page may be opened.

Memory controller system 1 preferably includes the option of processing a refresh of the memory device on a per-bank basis, where the added number of refresh commands is afforded by the added flexibility of selectively inhibiting normal data transaction access in only certain banks of a selectable chip/rank to accommodate refresh, while permitting normal data transaction access to resume in other banks. Memory controller system 1 preferably also includes the option of processing a refresh of the memory device on a per-chip (or per-rank) basis, which necessitates far less number of refresh commands, yet preserves much of the flexibility by selectively inhibiting normal data transactions in only certain chips/ranks to accommodate refresh, while permitting normal data transaction access to resume in other chips/ranks. Memory controller system 1 automatically monitors the execution status of memory access commands and the applicable timing requirements for refresh, to adaptively schedule incremental refresh away from those chips, for instance, currently either undergoing execution or pending sufficiently imminent execution. As a safeguard measure, where the accrued conditions within a refresh time window threaten violation of the applicable requirements, memory controller system 1 overrides such adaptive refresh processing to forcibly close and systematically refresh all remaining memory cells of chips needing to be timely refreshed.

This optimizes refresh in a number of respects. First, operational efficiency is enhanced by intelligently actuating refresh operations during those times when the refreshed memory cells would remain idle anyway. To that extent, the overhead costs of refresh may be largely hidden in the costs incurred for normal data transaction access to memory continuing to occur for memory cells of other active chips.

Second, operational flexibility is enhanced by the ability to selectively adjust when a particular increment of refresh is actually carried out. Under widely adopted standards, particular increments of refresh may be deferred or conducted in advance within predefined limits. For example, currently known JEDEC standards permit incremental refresh operations to be deferred or advanced by up to 9 tREFI time intervals for the given memory device. A request count parameter is suitably maintained to indicate a number of deferred refresh operations in terms of tREFI time intervals. Memory controller system 1 may therefore conduct the same number of refresh operations, but adaptively bunch them together in time or spread them out in time, based on the data transactional traffic. This flexibility may be exploited advantageously to productively fill 'dead time' in the data transactional traffic, and to yield longer, more extended periods of normal data transaction access to memory without interruption for refresh maintenance operations.

Figure 2:
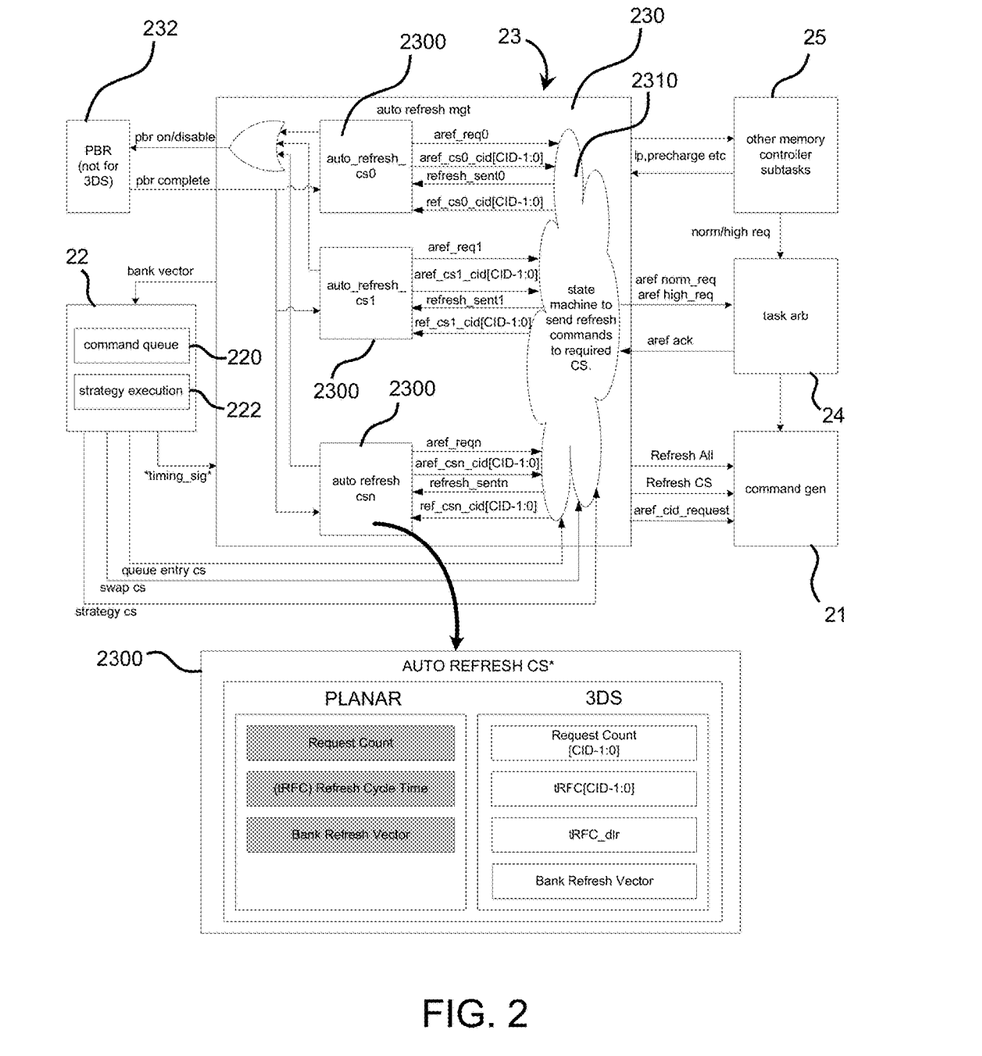
FIG. 2 is a schematic diagram showing one exemplary embodiment of a command control segment of the system embodiment of FIG. 1, illustrating an intercoupling of portions thereof in a sample application.

Referring to FIG. 2, there is shown a schematic diagram illustrating the intercoupling of certain functional portions of the command control segment 10 of memory controller system 1, as formed in accordance with one exemplary embodiment of the present invention. In the interests of brevity and clarity, only certain portions of the overall command control segment 10 pertaining to its refresh control functions are illustrated. Those other portions of the command control segment 10, as well as the other segments 20, 30 of the memory controller system 1, which are not shown or specifically described may be of any suitable type known in the art configured to suit the particularly intended application. The particular details of such other portions and segments will be apparent to those skilled in the art.

The command control portion 10 in the illustrated embodiment shown may be suitably configured for implementation in any suitable type device known in the art requiring periodic refresh. One example of such implementation is in connection with a memory controller for controlling a DDR (double data rate) synchronous dynamic random-access memory (DDR SDRAM), which in the example shown utilizes ECC of suitable format.

The command control segment 10 is preferably formed by one or more digital circuits which implement the functional logic for generating and managing commands to actuate various data access operations of the operation control segment 20. The command control segment 10 preferably includes a command generation portion 21 configured to generate commands for actuating the various operational tasks on the memory device, including at least read, write, and refresh operations for selectively addressed storage cells of the memory device. The command control segment 10 preferably also includes a command management portion 22 for storing and strategically selecting the commands to be executed, and a refresh management portion 23 for adaptively scheduling and requesting suitable refresh commands according to a selected level of refresh granularity.

The command management portion 22 preferably includes a command queue unit 220 storing command entries for operational tasks on the memory device awaiting execution. The command management portion 22 preferably also includes an execution strategy unit 222 coupled to the command queue unit 220 for selecting the commands stored in that command queue unit 220. The execution strategy unit 222 executes to selectively direct accepted command entries of the command queue unit 220 for timely execution of corresponding operational tasks on the given memory device. The execution strategy unit 222 serves in the meantime to hold the command under execution.

The command generation portion 21 of the memory controller system 1 is implemented to the extent practicable to make use of the memory controller system's other conventional capabilities to generate the various refresh commands in response to requests prompted by the refresh management portion 23. As shown, for example, the command generation portion 21 responds accordingly to generate suitable refresh commands responsive to such requests as: Refresh All, Refresh CS, and Refresh CID command requests. Depending on the type of memory device and particular mode of operation at hand, the resulting commands serve to effect a systematic refresh of all chips of the given memory device, a selective refresh of certain chips, or a selective refresh of certain chips/ranks of particular chip stacks and/or levels (in the case of a 3DS stacked device structure).

The refresh management portion 23 is coupled as shown to the command generation and command management portions 21, 22 for actuating a plurality of refresh operations in adaptively interleaved manner with other operational tasks. Full recursive refresh of the storage cells is thereby carried out for the memory device within a predetermined refresh time window parameter, such as the parameter tREFW defined by JEDEC standards. Preferably, the refresh management portion 23 provides for adaptive incremental refresh of the given memory device on a per-chip (or per-rank, depending on the memory device's physically implemented structure) level of granularity, or on a per-bank level of granularity. Accordingly, the refresh management portion 23 includes alternatively executable chip refresh unit and bank refresh units 230, 232.

The chip refresh unit 230 is executable to selectively actuate a refresh operation for a chip-based selection of memory storage cells, such that the storage cells in all banks of a selected chip are refreshed, while normal data transaction operations are free to occur in the other chips. The bank refresh unit 232 is preferably disabled for a selected chip, while the chip refresh unit 230 is executing to refresh that selected chip. Alternatively, the bank refresh unit 232 is executable to selectively actuate a refresh operation on a bank-based selection of storage cells within a certain chip, such that the storage cells in all pages of a chip's selected bank are refreshed, while normal data transaction operations are free to occur in the other banks of that chip.

The command generation and refresh management portions 21, 22 are operably coupled as shown to a task arbiter portion 24. The refresh management portion 22 is also operably coupled to one or more portions 25 for controlling other memory control tasks like memory cell precharge and the like. While shown as part of the command control segment 10, these portions 24, 25 may be suitably implemented as part of other segments of the memory controller system 1. The portions 24, 25 may be any suitable manner known in the art formed by one or more digital circuits implementing the functional logic to carry out their respective functions.

The task arbiter portion 24 is coupled to receive suitable signals from both the refresh management portion 23 and the control portion(s) 25 for one or more subtasks of the memory controller system 1. Preferably, these signals indicate a degree of priority to be associated with requests from these portions 23, 25 for commands to access memory in connections with various operational tasks. The arbiter portions 24 executes to determine the appropriate order (for the given embodiment and application) in which to grant competing memory access command requests.

Figure 3:
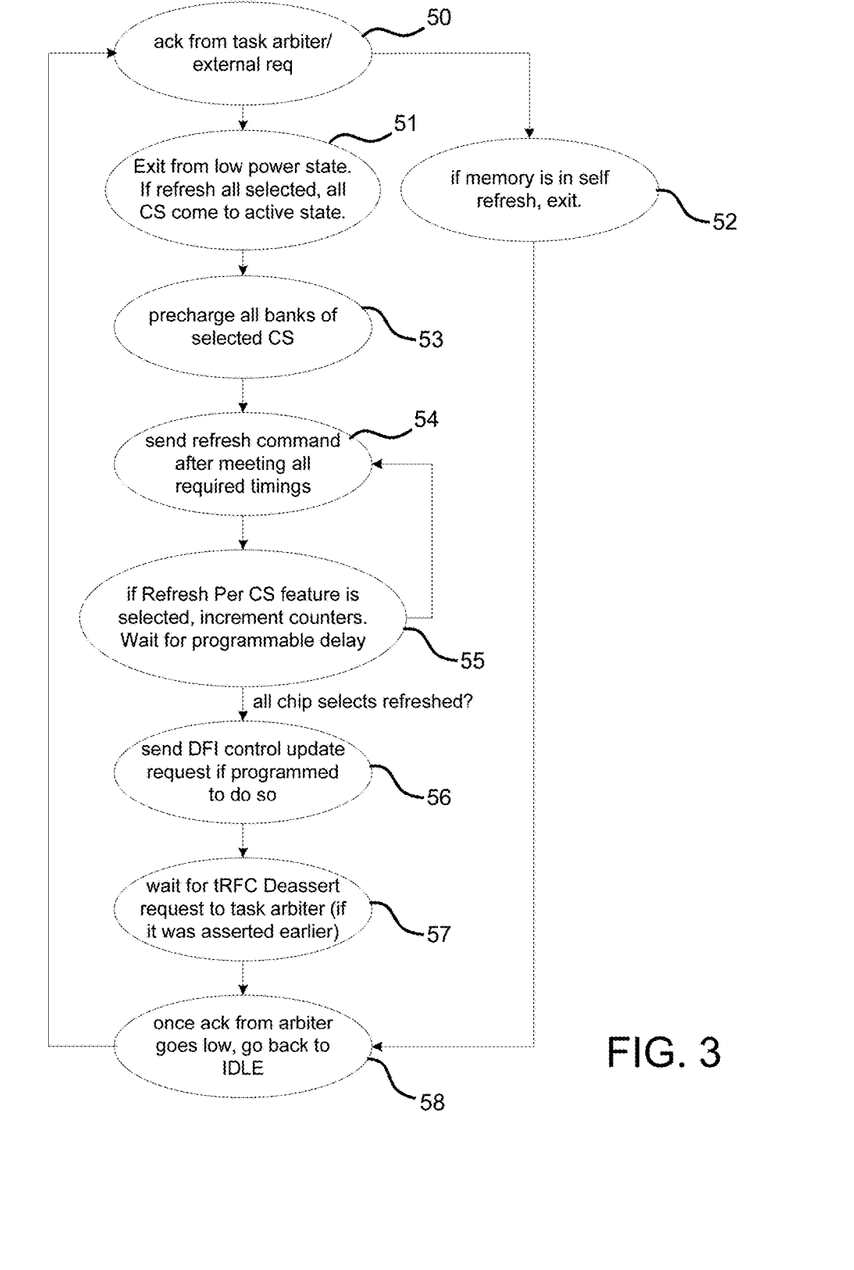
FIG. 3 is a flow diagram illustrating a flow of processes generally carried out by a refresh management portion of the command control segment in the system embodiment of FIG. 1, in a sample application; and, FIG. 4 is a flow diagram illustrating a flow of processes carried out by a chip refresh unit of the refresh management portion shown in the system embodiment of FIG. 1, in a sample application.

Turning to FIG. 3, a high level flow chart is shown, illustrating a flow of processes generally carried out by the refresh management portion 23 in accordance with one exemplary embodiment of the present invention. The refresh management portion 23 is preferably configured to handle all auto refresh commands of the memory controller system 1. To actuate refresh commands, the portion 23 at block 50 secures acknowledgment from the task arbiter portion 24 operationally as needed, and interacts with other subtasks of portion 25 to bring selectable chips out of power down state and precharge the banks of those chips, as indicated at blocks 51 and 53. The portion 23 then executes to issue refresh commands for each chip select as needed, as indicated at block 54. If the refresh per CS option is selected (as opposed to refresh all or refresh per bank), refresh commands for each selected CS are adaptively scheduled and carried out at block 55, as disclosed herein. Depending on the particular application, a programmable delay may be interposed between refresh commands to prevent unduly sudden rise in power consumption. Any updates required following refresh of all CS's in the given application, such as to physical interface control measures, are then carried out at block 56. Once applicable refresh cycle time requirements are met, including for instance the refresh cycle time, the memory refresh portion 23 executes at block 57 to operationally release the task arbiter portion 24 and return to idle upon the previously active task arbiter acknowledgment going low, as indicated at block 58.

The refresh management portion 23 is preferably configured to support memory devices equipped with self-refresh measures, by which the memory device internally maintains its own refresh. Such self-refresh measures tend to operate in low power mode, typically when memory is idle. Certain applicable standards, however, permit limited non-data commands to be issued during self-refresh mode. As indicated at block 52, when the memory device is in self-refresh mode, the refresh management portion 23 suspends refresh command processing. Refresh states including an internal request count value as of the time the device enters self-refresh are kept constant while self-refresh progresses, until refresh command processing is resumed.

Refresh Management Portion

Referring back to FIG. 2, the refresh management portion 23 is preferably configured to actuate a systematic refresh of all selectable chips of the given memory device, when needed, or a selective refresh on either a per-chip or per-bank basis. When it executes to carry out a refresh of all chips, the refresh management portion 23 serves, among other things, to carry out the following:

Issue refresh commands for all chips (selectable by a chip select (CS)). The chips are brought out of power down state, and a precharge command is generated for all chips. So if there were pages open for a currently executing data transaction command, or for any other pending command, the open pages would be closed by a suitable precharge command Inhibiting release of the task arbiter portion 24 until applicable refresh cycle time requirements are met following a refresh operation. As no other task is permitted to send any request during this time, the resulting idle time affords opportunity to carry out necessary support operations such as physical memory interface set up processes or the like suitable for the given application.

The refresh management portion 23 preferably serves, in addition, to carry out the following:

Monitor and control adaptively scheduled refresh of each CS independent of the others.

Selectively precharge the banks of only the CS selected for refresh, without affecting commands to other CS's.

Determine which CS is to be refreshed, based on refresh priority and the state of CS in execution strategy, command swap, and/or command queue entries. This ensures that normal priority refresh commands for a CS are precluded from interrupting currently executing or impending commands involving that CS.

Release the task arbiter portion 24 so that commands for other CS's may be sent by the memory controller system 1, once a refresh command for a selected CS is sent. The execution strategy, command swap, and/or command queue units are suitable alerted by the portion 23 that the banks in the selected CS have yet to meet the refresh cycle time, although the freed task arbiter is available to support commands for other CS's in the meantime.

Refresh commands handled by the refresh management portion 23 may be originated both internally and externally. First, a refresh command may be triggered according to an internal request count maintained for each CS. As noted, a device such as a DDR device complying with applicable standards such as JEDEC requires refresh cycles at an average periodic interval of tREFI. The internal request count keeps track of refresh commands for each CS with respect to the applicable tREFI interval. After power on sequence is complete, for example, a counter may be loaded with a certain programmable value corresponding to the tREFI interval. This counter recursively counts down the tREFI interval to zero, and the internal request count is incremented by one with each recursive countdown. Any software refresh requests also cause the internal request count to be increment.

To preserve optimum efficiency, postponement of by as much as a predetermined maximum number of refresh command deferrals (such as 8, for example) is preferably permitted during operation. Suitable registers for storing threshold values for normal and high refresh priority, for example, may be employed to track and limit the accrual of refresh command deferrals. While the internal request count remains compliant with the normal priority threshold, refresh management portion 23 sends a normal priority request to the task arbiter portion 24 for a given refresh command request. When the internal request count passes the high priority threshold, refresh management portion 23 sends a high priority request to the task arbiter portion 24 for immediate arbiter acknowledgment. Once it receives the arbiter acknowledgment, refresh management portion 23 proceeds with override processing of the refresh command request, consistent with the flow of processes illustrated in FIG. 3. The internal request count for a CS is decremented accordingly upon refresh of all its banks.

Refresh commands handled by the refresh management portion 23 may also be generated in the illustrated embodiment responsive to external refresh requests from portion(s) 25 for carrying out other subtasks supported by the memory controller system 1. Examples of such subtasks possibly requiring refresh as part of its operation include low power control, DFS, BIST, levelling, self-refresh modules, and the like. The refresh management portion 23 receives such external refresh requests for handling. Since the task arbiter portion 24 will have already been grabbed by the requesting module, refresh management portion 23 may proceed directly with actuating the necessary refresh commands without having to secure prior task arbiter acknowledgment.

Bank Refresh Unit

The bank refresh unit 232 when optionally executed serves to carry out refresh of memory cells on a per bank basis. Although per bank refresh (PBR) results in a greater number of refreshes than a refresh all or per chip refresh, it heightens the granularity of refresh to the extent that individual banks within the same CS may be independently opened and closed, such that refresh may proceed in one bank while data transaction operations like read and write commands may continue to occur in other banks not targeted by the refresh. The overhead of refresh may be virtually hidden with high flexibility, if the scheduling of bank refreshes are managed intelligently.

The PBR logic carried out by the bank refresh unit 232 (or PBR unit) may be implemented by digital circuitry configured in any suitable manner known in the art. The bank refresh unit 232 executes in coordination with the chip based auto refresh logic implemented by suitable digital circuitry in the chip refresh unit 230. In that regard, the PBR of bank refresh unit 232 preferably operates much as a subsystem of unit 230. With PBR and chip based auto refresh logic, there are three zones in which the logic preferably operates, and preferably two thresholds to define the transitions therebetween. The first zone of operation may be defined, for instance, to cover situations where PBR is enabled and chip based auto refresh is disabled. A second zone of operation may be defined to cover to cover situations where chip based auto refresh is enabled and PBR is disabled. A third zone of operation may be defined to cover the first situation, but where PBR cannot adequately keep up with the refresh required by applicable standards, and chip based auto refresh is activated as an adaptively optimized safeguard measure. Regardless of PBR activation, therefore, the chip based auto refresh executed by the chip refresh unit 230 is configured to maintain the refresh request count relative to tREFI and debit/credit information associated therewith for each CS.

Chip Refresh Unit

In accordance with certain aspects of the present invention, the chip refresh unit 230 actuates a refresh operation for selected ones of the n chips illustrated for the given memory device (individually selectable by corresponding chip select signals cs0, cs1, . . . csn). The chip(s) to be refreshed is preferably selected responsive to determination of a priority level for the chip. If a version of the JEDEC standards are assumed to apply to the given memory device, a refresh for the memory cells of a selectable chip may be deferred or advanced by as many as 9 tREFI intervals. In that case, the highest priority level indicates in the illustrated embodiment that all refresh deferral options available for a selected chip within the current tREFW have been exhausted. Such high priority level for a requested refresh triggers an override refresh operation on that chip, lest the tREFI refresh requirement be violated. On the other hand, a lower or normal level of priority indicates that that the chip remains available to deferral of a refresh operation thereon if necessary, and permits adaptive shuffling in schedule for its refresh request within the current tREFW.

In addition to such refresh priority parameter, the chip refresh unit 230 in the illustrated embodiment executes to adaptively maintain for each of the n chips one or more activity state parameters indicating whether the chip is subject to access by a command for an operational task that is currently under execution, or by a pending command for an operational task scheduled for execution within a predefined period of pendency. This period of pendency may be suitably defined for example in terms of time proximity (within a certain period of time), or in terms of queued commands (within a certain number of queued commands). The chip refresh unit 230 thereby adaptively actuates refresh operations, where possible, only for those chips that would remain idle during the predefined period of pendency. The unit thus inhibits refresh operations for those chips undergoing an active operational task during the predefined period of pendency, so as to minimize disruption of normal memory utilization.

Chip Refresh Unit: Refresh Monitoring Section

In the illustrated embodiment, the chip refresh unit 230 maintains a counter to keep track of the average periodic intervals tREFI's as time elapses. The unit 230 preferably includes for each chip (or for each chip select cs0, cs1, . . . csn) a corresponding refresh monitoring section 2300. Each refresh monitoring section 2300 maintains for its chip/chip select a refresh deferral history within the current refresh window tREFW. In the embodiment illustrated, this deferral history is preferably maintained in the form of a request count for each selectable chip, indicating the number of refresh operations deferred (if any) relative to the average periodic interval tREFI (indicating the frequency of refresh operations required for full refresh of the memory device within the refresh window tREFW).

The request count is incremented each time a tREFI expires. In certain situations, outside requests for refresh of a chip may be generated in connection with other subtasks. For example, a time skew leveling operation may invoke a directed refresh of a certain chip. As those refresh operations occur outside the normal course of self-actuated maintenance refresh, the request count is also incremented with each occurrence of such outside requests for refresh of the chip. The request count is decremented each time a refresh of the given chip is completed (or a per-bank refresh is completed for the chip). When the request count reaches a predefined maximum count (such as the maximum number of refresh deferrals), the refresh priority parameter is set to the high level to force an overriding refresh operation for the chip.

Each refresh monitoring section 2300 also maintains for its chip/chip select a timer for a refresh cycle time corresponding to the current refresh window tREFW. This refresh cycle time represents the recovery time required for the chip following a refresh operation thereon, before it may be accessed again for another operation. Each refresh monitoring section 2300 additionally maintains for its chip/chip select a bank refresh vector whose entries indicate the corresponding refresh states of the chip's banks, during the current refresh window tREFW. The vector may be formed, for example, by a concatenation of bits, one bit for each bank of the chip. When a chip undergoes a refresh operation, this vector's bits for the chip are all set to indicate that all banks are under refresh. This lasts until the refresh cycle time elapses, at which point the vector's bits are reset to their null values to indicate that the banks are once again accessible.

As shown, the memory controller system 1 preferably accommodates memory devices configured with a stacked device structure having at least one multi-level stack of component chips, where for instance each selectable chip stack (addressed by a corresponding CS) includes one or more selectable chips (addressed by a corresponding CID). For such 3DS device applications, each refresh monitoring section 2300 maintains the request count, refresh cycle time timer, and bank refresh vector preferably for each selectable stack (CS) and chip level (CID) combination. Each refresh monitoring section 2300 additionally maintains for each chip stack in 3DS device applications a timer for enforcing a predetermined minimum delay (tRFC_dlr) between successive refresh requests for selectable chips/levels of the same chip stack.

In typical illustrative applications, a 3DS packaged device may be organized into two, four or eight logical ranks. No more than one logical rank refresh command may be initiated at a time in these applications. Typically, the minimum refresh cycle time for a logical rank equates to the refresh cycle time tRFC for a comparable planar device of like memory density. There is a minimum cycle time between refresh commands issued to different logical ranks of the device. But after a refresh command issues to a logical rank, other valid operational commands may be issued and processed in the meantime by other logical ranks that are not the target of refresh.

With each chip stack of the 3DS device selectable by a corresponding chip select (CS), each component chip level in a selected chip stack may be separately refreshed by corresponding logical rank (CID). While refresh may be carried out in typical 3DS application for at most one CID at a time per CS, refresh is adaptively scheduled where practicable for a CID that is free of any current or proximately pending data transaction access. Logic is suitably implemented in this regard to intelligently choose which CID to refresh in a given CS. Then, upon refresh of that CID, further refresh of a CID on that same CS is inhibited for the predetermined minimum delay time period immediately thereafter. The maximum number of refreshes sent at any given point is therefore the maximum number of CS's in typical 3DS applications.

There are numerous approaches to implementing CID-based adaptive refresh in such stacked device structure applications. For example:

1. Implementing a separate refresh monitoring section for each CS, with each section containing sub-sections to monitor per CID. This simplifies the architecture to effect optimum selection of the CID to refresh, but the configurational hierarchy necessitates sending n (number of CS) number of refresh commands on the given interface, and precludes grouping multiple CS's with the same CID.
2. Implementing a separate refresh monitoring section per CS per CID, such that total number of refresh monitoring sections equals (number of CS)×(number of CID). This yields a greater number of refresh monitoring sections and yields redundancy to the extent that the sections cannot operate at the same time. The implementation requires the predetermined minimum delay tRFC_dlr to be maintained between CID's of same CS.
3. Implementing a separate refresh monitoring section for each CID, with each section containing sub-modules to monitor per CS. This permits multiple CS's to be grouped under the same CID. So, if a user opts for staggered refreshes, the refresh command to one CID of multiple CS instances may be issued in a single command cycle. But the logic required to adaptively select the CS's under a CID tends to be more complex, requiring care such that in grouping CS's under the same CID, refreshing a CID of one CS (for example, $CID_0$ in $CS_1$), does not hinder a high priority refresh requested by another CID of the same CS (for example, $CID_1$ in $CS_1$).

Given that staggering refreshes helps significantly to reduce peak power consumption, the first architectural approach is preferable in many 3DS stacked device applications. Since refresh commands are invariably sent per CS per CID in the case of staggered refreshes, no performance is lost on that basis. Moreover, the CID selection process per CS keeps complexity down, as each CS is independent of one another. Compared to the other approaches, implementing one refresh monitoring section per CS, and maintaining multiple counters corresponding to each CID, also most closely preserves architectural consistency with devices having planar structure.

As noted herein, the required periodic refresh for each CS may be adaptively controlled to minimize disruption of data transaction operations that need to access memory. The flexibility with which refresh commands may be scheduled around such data transaction operations is further optimized by keeping track of refreshes due for each CS independently, according to a credit/debit approach. Ideally, a particular CS is inhibited from disruptive refresh during those time periods when it is occupied by an operationally productive transaction, and refreshed during a time period when one or more other chips are occupied by operationally productive transactions. The flexibility to wait out its own operationally productive time period by postponing (or deferring) refresh certainly aids overall optimization of refresh, but each extension of that postponement increasingly limits (debits) its available postponements. Conversely, conducting additional refreshes during extended periods of inactivity for that CS increasingly replenishes (credits) its available postponements. A debit/credit measure is therefore independently maintained for each CS, in view of the applicable tREFI. The memory controller system 1 preferably maintains an ongoing measure of deficit or surplus of refreshes for each CS.

Chip Refresh Unit: Refresh Control Section

As shown in FIG. 2, the chip refresh unit 230 includes a refresh control section 2310 coupled to the respective refresh monitoring sections 2300 of the selectable chip. The refresh control section 2310 generates a refresh request for at least one of the selectable chips preferably in response to both the refresh deferral histories of the selectable chips and their activity states. Preferably, the refresh deferral history of each selectable chip indicates among other things that the chip either has at least one more tREFI interval by which to defer refresh (denoted for example, as a normal level of refresh priority), or that it has exhausted a predetermined limit of such tREFI intervals by which to defer refresh (denoted for example, as a high level of refresh priority).

A normal refresh priority level for a chip affords opportunity for an adaptive refresh cycle to proceed for that chip as disclosed herein. In contrast, a high refresh priority level for the chip raises alert conditions requiring immediate remedial action to avoid violation of periodic refresh requirements. An adaptive refresh cycle for that chip is superseded by an override refresh cycle which is imposed on the chip, even at the cost of interrupting or delaying data transaction operations occurring or pending upon that chip.

The activity state of each selectable chip preferably indicates whether the chip is subject to access by an operational task that is currently under execution, or is about to be executed within a predefined period of pendency. This period of pendency may be predefined for instance in terms of imminent occurrence within a certain time period, in terms of imminent occurrence within a certain number of queued commands, or in terms of other such suitable parameters. The activity state largely determines the adaptive scheduling of refresh for a given chip when the chip is of normal refresh priority. The activity state gives way for one or more override refresh cycles to be issued when the chip is found to be of high refresh priority.

The refresh control section 2310 of the chip refresh unit 230 is preferably implemented in the illustrated embodiment to include a state machine coupled to each of the refresh monitoring sections 2300, and to the command queue and execution strategy units 220, 222 of the command management portion 22. The state machine executes to determine which of the selectable chips is to be accessed by command(s) currently found either in the execution strategy unit 222 or within a predefined period of pendency within the command queue unit 220. As noted, the predefined period of pendency is preferably expressed, for instance, to indicate a certain number of successive commands most imminently awaiting execution.

The state machine of refresh control section 2310 acquires from the command management portion 22 identification of all CS's affected by all command entries (or selections) currently executing or pending. Such information is obtained through signals indicating, for example, each CS targeted by a command selected by the execution strategy unit, a command entry appearing within a predetermined number of the most recent entries in the command queue unit, or any command extracted for swap with another in order of execution.

Figure 4:
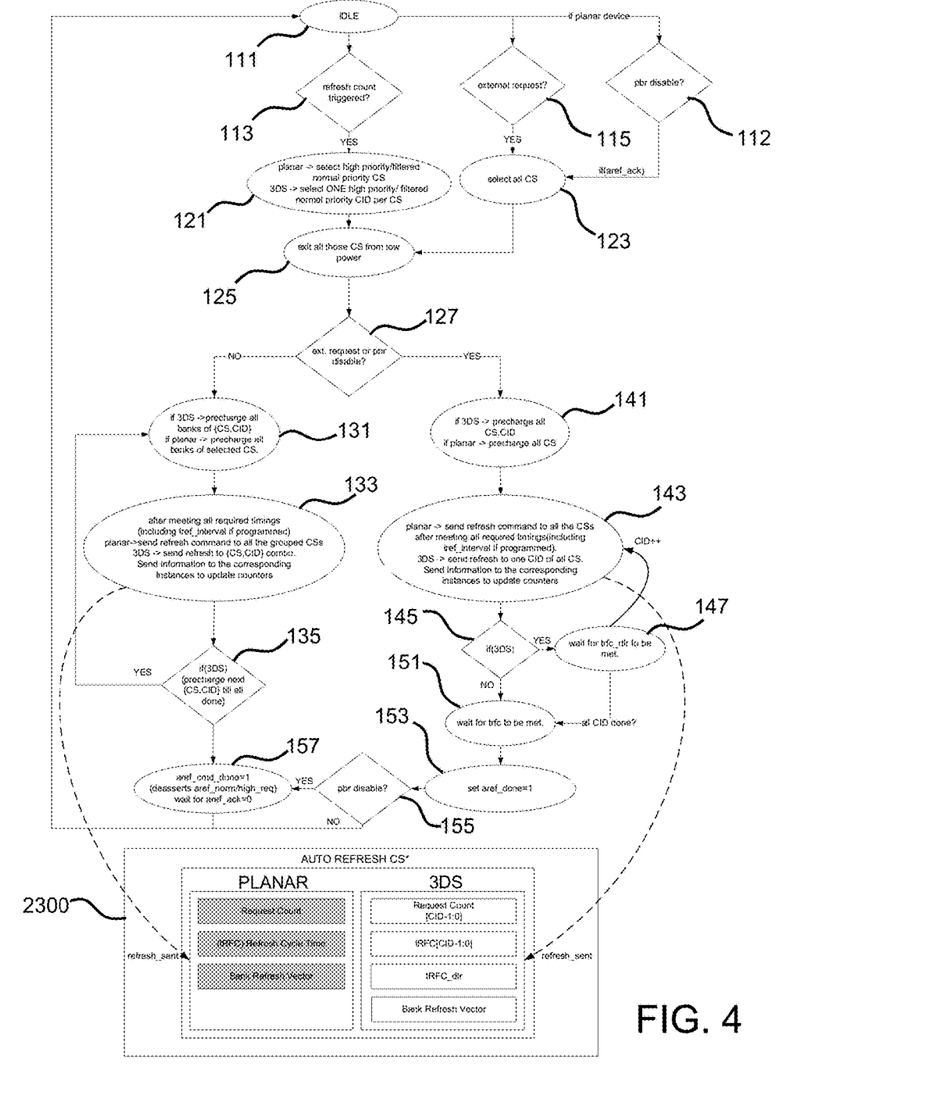

The state machine is coupled to interact with each of the refresh monitoring sections 2300 instantiated for the individual CS's. FIG. 4 illustrates a flow of processes carried out during this interaction in accordance with one exemplary embodiment of the present invention. As shown, the state machine of refresh control section 2310 in the illustrated embodiment and application begins at block 111 in an idle state, awaiting one of three triggering conditions: the request count reaching a predetermined threshold; an external subtask request being received; and, the per bank refresh mode being disabled. When these conditions are triggered as indicated respectively at blocks 113, 115, 112, the state machine executes as follows.

1. Refresh Request Count Reaching a Predetermined Threshold:

When any refresh monitoring section 2300 of the given CS's asserts a high priority refresh request, the refresh management unit 230 asserts a high priority request to the task arbiter portion 24. When any refresh monitoring section 2300 of the given CS's asserts assert a normal priority request, the refresh management unit 230 asserts a normal priority request to the task arbiter portion 24. Once the task arbiter acknowledgment is received, the state machine is triggered first to first select the CS to be refreshed, as indicated at block 121.

If the given memory device is of planar structure, the CS's of all refresh monitoring sections 2300 which raised high priority requests are selected for refresh. All CS's of all refresh monitoring sections 2300 with normal priority requests, and are not currently affected (targeted) by any execution strategy/command queue/command swap entry or selection are also selected for refresh. The number of command queue entries to look back in determining such CS's currently unaffected by a command may be made a programmable value (as a predefined period of pendency parameter). All the selected CS's are brought out of low power (LP), and all their banks are precharged, as indicated at blocks 125, 131. Refresh commands are sent to the selected CS's at block 133. The corresponding refresh monitoring section 2300 is informed of this refresh command issuance via a refresh sent signal. Upon receiving such receiving refresh sent signal, the refresh monitoring section 2300 updates its counters and timers accordingly. The high/normal priority request to the task arbiter portion 24 is then de-asserted at block 157, and the task arbiter portion 24 thereby freed to take up a request from any other subtask.

If the given memory device is of stacked 3DS structure, only one CID may be refreshed at a time within each CS. Each refresh monitoring section of a CS 2300 asserting normal or high refresh priority request, sends identification of its CID's to be refreshed using for instance the signal aref_cs*_cid signal (see FIG. 2). For a high priority request, all CID's for which the internal request count has crossed the corresponding high priority threshold are set for refresh. For a normal priority request, all CID's for which request count has crossed the corresponding normal priority threshold are set for refresh. If there are any high priority CID's, the refresh management portion 23 selects one such CID for refresh. If only normal priority CID's are identified, then the refresh management portion 23 selects the most optimum CID based on information pertaining to affected/unaffected [CS, CID] combinations received from the command management portion 22.

Precharge commands are sent to each [CS, CID] combination at block 131, followed by its refresh command The corresponding refresh monitoring section 2300 is informed of this refresh command issuance via a refresh sent signal provided along with aref_cs*_cid indicating the CID information. On receiving the refresh sent signal, each refresh monitoring section 2300 updates its counters and timers accordingly. The high/normal priority request to the task arbiter portion 24 is then de-asserted at block 157, and the task arbiter portion 24 thereby freed to take up a request from any other subtask. The next refresh request is thereafter asserted by each refresh monitoring section 2300, but only after the predetermined tRFC_dlr (minimum delay between successive refresh requests for selectable CID's on the same CS) is met. During this tRFC_dlr delay time, non-refresh data transaction commands to other CID's on the same CS may be executed. As noted below, the scenario is different if the refresh was requested by an external subtask.

2. External Subtask Request:

When any external subtask request for auto refresh is received, the state machine is triggered for refresh of all CS's (and CID's, if a 3DS memory device) irrespective of its state in execution strategy/command queue/command swap, as indicated at block 123. So once the state machine receives an external subtask request, it pulls all CS's out of low power state, as indicated at block 125. In the case of planar memory devices, a command to precharge is sent to all CS's, as illustrated at blocks 127 and 141. Once precharge is done, a refresh command is sent for all CS's. The corresponding refresh monitoring section 2300 is informed of this refresh command issuance via a refresh sent signal. Once the refresh cycle time (tRFC) timing is met at block 151, a signal indicating completion of refresh is set at block 153, and the state machine moves to idle state.

In the case of 3DS memory devices, the state machine is triggered for refresh of all CID's in all CS's. Preferably, all CS's are refreshed under one CID, wait for tRFC_dlr to expire—increment to the next CID—then refresh all CS's under this CID, and continue the process until all CID's are exhausted. The refresh management module thus precharges all CID's in all CS's at block 143. Starting from $CID_0$, refresh commands are sent to all CS's. A refresh sent signal is asserted along with CID information to all refresh monitoring sections 2300. Once the tRFC_dlr counter (or timer) expires, the state machine moves to the next CID. The process continues until all CID's are refreshed in this manner. The state machine thereafter waits for the refresh cycle time (tRFC) counter to expire at block 151, after which a signal indicating completion of refresh is set at block 153, and the state machine moves to idle state.

3. Pbr Disable:

If the Per Bank Refresh (PBR) feature is turned on, the refresh commands are primarily handled by the PBR unit 232. Nonetheless, each refresh monitoring sections 2300 maintains the counter for tREFI and the internal refresh request count. The request count is incremented as usual when the counter for tREFI counts down to zero, and decremented when it receives indication of a synchronizing event such as completion of a PBR cycle from unit 232. Threshold based measure, or any other suitable measure known in the art, may be employed to determine if the number of refreshes is falling behind at any given point in time. Each refresh monitoring section 2300 compares against such measures, and the refresh management portion suitably collate all the requests, and sends appropriate instruction based thereon to the PBR logic executing on unit 232.

If a PBR disable signal is asserted, as indicated at block 117, each refresh monitoring section 2300 raises either a normal or high priority request, since its request counter would have crossed one of the priority threshold values. That is, the abrupt disabling of the per bank refresh feature under the prevailing conditions indicates that the PBR unit 232 has failed to keep up with the required refresh commands. This causes the refresh management portion 23 to assert a corresponding refresh normal/high priority request. The portion 23 sends refresh commands to all CS's irrespective of its state in execution strategy/command queue/command swap, so as to lower the number of outstanding refreshes. Once a task arbiter acknowledgment is received, a precharge all command is sent for all CS's. A refresh command is sent for all CS's, and the corresponding refresh monitoring sections 2300 are informed of this refresh command issuance via a refresh sent signal. After the tRFC timing is met at block 151, a signal indicating completion of refresh is set at block 153, and (subject to confirmation of PBR disable condition at block 155) the flow proceeds to block 157. The high/normal priority request to the task arbiter portion 24 is then de-asserted at block 157, and the task arbiter portion 24 thereby freed to take up a request from any other subtask.

The refresh requests from individual refresh monitoring sections 2300 go low only when their request counts go below the threshold value. Until then, the PBR disable condition remains active. Once the refresh management portion 23 receives a task arbiter acknowledgment, the above mentioned process is repeated.

This PBR disable triggering condition is applicable only for those planar memory devices whose refreshes are primarily managed with the assistance of the per bank refresh (PBR) module. These tend to be smaller devices having one or just a few ranks. As memory is populated with greater numbers of ranks, actuating separate refreshes for each of the numerous ranks increasingly invokes power consumption concerns, such as unduly high current draw. The advantages deriving from higher granularity of refresh tend to be prohibitively outweighed by such concerns as the ranks increase in number.

Although this invention has been described in connection with specific forms and embodiments thereof, it will be appreciated that various modifications other than those discussed above may be resorted to without departing from the spirit or scope of the invention as defined in the appended claims. For example, functionally equivalent elements or processes may be substituted for those specifically shown and described, certain features may be used independently of other features, and in certain cases, particular locations of the elements or processes may be reversed or interposed, all without departing from the spirit or scope of the invention as defined in the appended claims.

What is claimed is:

1. A system for adaptive refresh of a memory device having multiple integrated circuit chips, the system comprising:
   a command generation portion executable to generate commands for actuating a plurality of operational tasks on the memory device, the operational tasks including at least read, write, and refresh operations for selectively addressed storage cells of the memory device, each chip of the memory device defining a plurality of banks, the storage cells of each bank being organized in a plurality of individually accessible pages;
   a command management portion coupled to said command generation portion, said command management portion including:
      a command queue unit storing the commands for operational tasks on the memory device awaiting execution; and,
      an execution strategy unit coupled to said command queue unit for selecting the commands stored in said command queue unit for timely execution of corresponding operational tasks on the memory device; and,
   a refresh management portion coupled to said command generation and command management portions for scheduling actuation of a plurality of refresh operations to be adaptively interleaved with other operational tasks, wherein full recursive refresh of the storage cells is carried out for the memory device within a predetermined refresh window of time, said refresh management portion including:
      a chip refresh unit executable to selectively actuate each refresh operation for a chip-based selection of storage cells, a refresh request for a selected chip actuating a series of refresh operations to collectively refresh the storage cells of the selected chip, whereby for each refresh request for a selected chip the storage cells in all banks of the selected chip are collectively refreshed by the series of refresh operations exclusive of actuation of other operational tasks directed to the selected chip, and
      a bank refresh unit executable to selectively actuate each refresh operation for a bank-based selection of storage cells, whereby the storage cells in a selected bank are refreshed, the bank refresh unit having an enable/disable input controllable by the chip refresh unit, whereby the chip refresh unit can enable and disable the bank refresh unit to adaptively adjust the granularity of the refresh operation of the memory device according to three zones of operation, the zones including:
         a first zone in which the bank refresh unit is enabled and a memory-chip-based auto refresh is disabled,
         a second zone in which the bank refresh unit is disabled and the memory-chip-based auto refresh is enabled, and
         a third zone in which the bank refresh unit is enabled and a memory-chip-based auto refresh is enabled only upon determination that the bank refresh unit is unable to refresh the bank-based selection of storage cells within a required refresh time,
      wherein the memory-chip-based auto refresh is executed by the chip refresh unit to maintain the refresh request count relative to an average periodic refresh interval time parameter and refresh time debit/credit information associated therewith for the chip-based selection of storage cells.

2. The system as recited in claim 1, wherein said chip refresh unit selectively actuates a refresh operation for a chip responsive to determination of at least one of first and second states for the chip, the chip in the first state having exhausted all refresh deferral options available therefor within the predetermined refresh window, the chip in the second state remaining available to deferral of a refresh operation therefor.

3. The system as recited in claim 2, wherein:
   said chip refresh unit is configured to adaptively maintain for each selectable chip of the memory device:
      a refresh priority parameter indicative of a refresh deferral history for the selectable chip within the predetermined refresh window; and,
      an activity state parameter indicative of access to the selectable chip by a current or scheduled command for an operational task to be executed within a predefined period of pendency;
   said chip refresh unit thereby adaptively scheduling actuation of refresh operations for chips remaining idle during the predefined period of pendency, whereby the storage cells in all banks of a selected idle chip are refreshed exclusive of actuation of other operational tasks directed to the selected chip, and
   said chip refresh unit thereby inhibiting refresh operations for chips undergoing an active operational task during the predefined period of pendency.

4. The system as recited in claim 2, wherein said chip refresh unit includes:
   a refresh monitoring section for each selectable chip of the memory device, said refresh monitoring section maintaining a refresh deferral history for the selectable chip within the predetermined refresh window; and,
   a refresh control section coupled to each said refresh monitoring section of each selectable chip, said refresh control section generating a refresh request for at least one of the selectable chips responsive to the refresh deferral histories of the selectable chips and activity states of the selectable chips with respect to execution of an operational task thereon within a predefined period of pendency.

5. The system as recited in claim 4, wherein said refresh control section of said chip refresh unit includes a state machine coupled to each said refresh monitoring section and to said command queue and execution strategy units, said state machine determining the selectable chips to be accessed by at least one command in said execution strategy unit or by at least one command in said command queue unit within said predefined period of pendency, said predefined period of pendency indicating a corresponding number of successive commands most imminently awaiting execution.

6. The system as recited in claim 4, wherein said chip refresh unit maintains for each of the selectable chips a refresh priority parameter updated in value according to the refresh deferral history of the selectable chip, said refresh control section generating an override refresh request for a selectable chip responsive to said refresh priority parameter indicating a high priority refresh condition therefor, the override refresh request when generated for a selectable chip overriding the activity state thereof.

7. The system as recited in claim 6, wherein each said refresh monitoring section maintains for at least one of the selectable chips:
- a request count indicating a number of deferred refresh operations relative to an average periodic interval, the average periodic interval indicating the frequency of refresh operations required for full refresh of the memory device within the predetermined refresh window;
- a timer for a refresh cycle time corresponding to the predetermined refresh window, the refresh cycle time representing a required recovery for the selectable chip following a refresh operation thereon; and,
- an indication of refresh state within the predetermined refresh window for each of the banks in the selectable chip.

8. The system as recited in claim 7, wherein:
the memory device is configured with a stacked device structure having at least one chip stack, each including a plurality of selectable chip levels; and,
said refresh monitoring section additionally maintains for each of the chip stacks a timer for enforcing a predetermined minimum delay between successive refresh requests for the selectable chip levels of the same chip stack.

9. The system as recited in claim 7, wherein said request count for a selectable chip is incremented with expiration of each average periodic interval without execution of a refresh operation for the selectable chip, and decremented upon each execution of a refresh operation for the selectable chip.

10. A method for adaptive refresh of a memory device having multiple integrated circuit chips, the method comprising:
defining a plurality of banks in each chip of the memory device, each bank being organized into a plurality of individually accessible pages, each page formed by a plurality of storage cells;
executing a command generation portion implemented in a processor to generate commands for actuating a plurality of operational tasks on the memory device, the operational tasks including at least read, write, and refresh operations for selectively addressed storage cells of the memory device;
executing command management on a command management portion implemented in a processor, said command management including:
 storing the commands for operational tasks on the memory device in a computer readable command queue unit to await execution; and,
 actuating an execution strategy unit coupled to said command queue unit to select the commands stored in said command queue unit for timely execution of corresponding operational tasks on the memory device; and,
 executing refresh management on a refresh management portion implemented in a processor for scheduling actuation of a plurality of refresh operations to be adaptively interleaved with other operational tasks, wherein full recursive refresh of the storage cells is carried out for the memory device within a predetermined refresh window of time, said refresh management including a per-chip refresh executable to selectively actuate each refresh operation for a chip-based selection of storage cells, a refresh request for a selected chip actuating a series of refresh operations to collectively refresh the storage cells of the selected chip or bank(s), whereby for each refresh request for a selected chip, the storage cells in all banks of the selected chip are collectively refreshed by the series of refresh operations exclusive of actuation of other operational tasks directed to the selected chip, and
 said refresh management further including a bank refresh executable to selectively actuate each refresh operation for a bank-based selection of storage cells, whereby the storage cells in a selected bank are refreshed, the bank refresh being enablable/disableable to enable or disable the bank refresh to adaptively adjust the granularity of the refresh operation of the memory device according to three zones of operation, the zones including:
  a first zone in which the bank refresh is enabled and a memory-chip-based auto refresh is disabled,
  a second zone in which the bank refresh is disabled and the memory-chip-based auto refresh is enabled, and
  a third zone in which the bank refresh is enabled and a memory-chip-based auto refresh is enabled only upon determination that the bank refresh unit is unable to refresh the bank-based selection of storage cells within a required refresh time,
 wherein, when the memory-chip-based auto refresh is enabled, the per-chip refresh includes the memory-chip-based auto refresh to maintain the refresh request count relative to an average periodic refresh interval time parameter and refresh time debit/credit information associated therewith for the chip-based selection of storage cells.

11. The method as recited in claim 10, wherein said per-chip refresh selectively actuates a refresh operation for a chip responsive to determination of at least one of first and second states for the chip, the chip in the first state having exhausted all refresh deferral options available therefor within the predetermined refresh window, the chip in the second state remaining available to deferral of a refresh operation therefor.

12. The method as recited in claim 11, wherein:
said per-chip refresh adaptively maintains for each selectable chip of the memory device:
 a refresh priority parameter indicative of a refresh deferral history for the selectable chip within the predetermined refresh window; and,
 an activity state parameter indicative of access to the selectable chip by a current or scheduled command for an operational task to be executed within a predefined period of pendency;
said per-chip refresh thereby adaptively scheduling actuation of refresh operations for chips remaining idle during the predefined period of pendency, whereby the storage cells in all banks of a selected idle chip are refreshed exclusive of actuation of other operational tasks directed to the selected chip, and
said per-chip refresh thereby inhibiting refresh operations for chips undergoing an active operational task during the predefined period of pendency.

13. The method as recited in claim 11, wherein said per-chip refresh includes:
executing refresh monitoring for each selectable chip of the memory device, said refresh monitoring maintaining a refresh deferral history for the selectable chip within the predetermined refresh window; and, executing refresh control for generating a refresh request for at least one of the selectable chips responsive to the refresh deferral histories and activity states of the selectable chips with respect to execution of an operational task thereon within a predefined period of pendency.

14. The method as recited in claim 13, wherein said refresh control includes executing a state machine coupled to said command queue and execution strategy units, and thereby determining the selectable chips to be accessed by at least one command in said execution strategy or command queue units within said predefined period of pendency, said predefined period of pendency indicating a corresponding number of successive commands most imminently awaiting execution.

15. The method as recited in claim 13, wherein said per-chip refresh includes maintaining for each of the selectable chips a refresh priority parameter updated in value according to the refresh deferral history of the selectable chip, said refresh control generating an override refresh request for a selectable chip responsive to said refresh priority parameter indicating a high priority refresh condition therefor, the override refresh request when generated for a selectable chip overriding the activity state thereof.

16. The method as recited in claim 15, wherein:
said refresh monitoring maintains for at least one of the selectable chips:
   a request count indicating a number of deferred refresh operations relative to an average periodic interval, the average periodic interval indicating the frequency of refresh operations required for full refresh of the memory device within the predetermined refresh window;
   a timer for a refresh cycle time corresponding to the predetermined refresh window, the refresh cycle time representing a required recovery for the selectable chip following a refresh operation thereon; and,
   an indication of refresh state within the predetermined refresh window for each of the banks in the selectable chip; and,
said request count for a selectable chip is incremented with expiration of each average periodic interval without execution of a refresh operation for the selectable chip, and decremented upon each execution of a refresh operation for the selectable chip.

17. The method as recited in claim 16, wherein:
the memory device is configured with a stacked device structure having at least one chip stack, each including a plurality of selectable chip levels; and,
said refresh monitoring section additionally maintains for each of the chip stacks a timer for enforcing a predetermined minimum delay between successive refresh requests for the selectable chip levels of the same chip stack.

18. A system for adaptive refresh of a memory device having multiple integrated circuit chips with selective granularity of refresh, the system comprising:
a command generation portion executable to generate commands for actuating a plurality of operational tasks on the memory device, the operational tasks including at least read, write, and refresh operations for selectively addressed storage cells of the memory device, each chip of the memory device defining at least one logical rank containing a plurality of banks, each bank being organized into a plurality of individually accessible pages, each page formed by at least one row of storage cells;
a command management portion coupled to said command generation portion, said command management portion including:
   a command queue unit storing the commands for operational tasks on the memory device awaiting execution; and,
   an execution strategy unit coupled to said command queue unit for selecting the commands stored in said command queue unit for timely execution of corresponding operational tasks on the memory device; and,
a refresh management portion coupled to said command generation and command management portions for scheduling actuation of a plurality of refresh operations to be adaptively interleaved with other operational tasks, wherein full recursive refresh of the storage cells is carried out for the memory device within a predetermined refresh window of time, said refresh management portion including:
   a bank refresh unit executable to selectively actuate each refresh operation for a bank-based selection of storage cells, whereby the storage cells in a selected bank are refreshed, the bank refresh unit having an enable/disable input, whereby the bank refresh unit can be enabled or disabled to adaptively adjust the granularity of the refresh operation of the memory device according to three zones of operation, the zones including:
      a first zone in which the bank refresh unit is enabled and a memory-chip-based auto refresh is disabled,
      a second zone in which the bank refresh unit is disabled and the memory-chip-based auto refresh is enabled, and
      a third zone in which the bank refresh unit is enabled and a memory-chip-based auto refresh is enabled only upon determination that the bank refresh unit is unable to refresh the bank-based selection of storage cells within a required refresh time,
   wherein the memory-chip-based auto refresh is executed to maintain the refresh request count relative to an average periodic refresh interval time parameter and refresh time debit/credit information associated therewith for the chip-based selection of storage cells; and,
   a rank refresh unit executable to selectively actuate each refresh operation for a rank-based selection of storage cells, a refresh request for a selected rank actuating a series of refresh operations to collectively refresh the storage cells of the selected rank, whereby, for each refresh request for a selected rank, the storage cells in all banks of the selected rank are collectively refreshed by the series of refresh operations exclusive of actuation, between individual refresh operations in the series for the selected rank, of other operational tasks directed to the selected rank and at least one rank other than the selected rank is scheduled to undergo at least one active operational task between individual refresh operations in the series for the selected rank, said rank refresh unit including:
      a refresh monitoring section for each selectable rank of the memory device, said refresh monitoring section maintaining a refresh deferral history for the selectable rank within the predetermined refresh window; and, a refresh control section coupled to each said refresh monitoring section of each selectable rank, said refresh control section generating a refresh request for at least one of the selectable ranks responsive to the refresh deferral histories and activity states of the selectable ranks with respect to execution of an operational task thereon within a predefined period of pendency.

19. The system as recited in claim 18, wherein:

said refresh control section of said rank refresh unit includes a state machine coupled to each said refresh monitoring section and to said command queue and execution strategy units, said state machine determining the selectable ranks to be accessed by at least one command in said execution strategy unit or by at least one command in said command queue unit within said predefined period of pendency, said predefined period of pendency indicating a corresponding number of successive commands most imminently awaiting execution; and, said refresh control section selectively actuates a refresh operation for a rank responsive to determination of at least one of first and second states for the rank, the rank in the first state having exhausted all refresh deferral options available therefor within the predetermined refresh window, the rank in the second state being free of pending access to any bank thereof for execution of an operational task.

20. The system as recited in claim 18, wherein:

said rank refresh unit is configured to adaptively maintain for each selectable rank of the memory device:

a refresh priority parameter indicative of a refresh deferral history for the selectable rank within the predetermined refresh window; and, an activity state parameter indicative of access to the selectable chip by a current or scheduled command for an operational task to be executed within a predefined period of pendency;

said rank refresh unit thereby adaptively scheduling actuation of refresh operations for rank remaining idle during the predefined period of pendency, whereby the storage cells in all banks of a selected idle chip are refreshed exclusive of actuation of other operational tasks directed to the selected chip, said rank refresh unit thereby inhibiting refresh operations for ranks undergoing an active operational task during the predefined period of pendency;

said refresh control section generates an override refresh request for a selectable rank responsive to said refresh priority parameter indicating a high priority refresh condition therefor, the override refresh request when generated for a selectable rank overriding the activity state thereof; and, refresh monitoring section maintains a request count indicating a number of deferred refresh operations relative to an average periodic interval, the average periodic interval indicating the frequency of refresh operations required for full refresh of the memory device within the predetermined refresh window, said request count being incremented with expiration of each average periodic interval without execution of a refresh operation for the selectable rank, and decremented upon each execution of a refresh operation for the selectable rank.

\* \* \* \* \*